United States Patent
Jin

(10) Patent No.: US 10,062,866 B2
(45) Date of Patent: Aug. 28, 2018

(54) OLED DISPLAY AND MANUFACTURING METHOD THEREOF

(71) Applicant: Wuhan China Star Optoelectronics Technology Co., Ltd., Wuhan (CN)

(72) Inventor: Jiangjiang Jin, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 52 days.

(21) Appl. No.: 15/328,895

(22) PCT Filed: Dec. 13, 2016

(86) PCT No.: PCT/CN2016/109572
§ 371 (c)(1),
(2) Date: Jan. 24, 2017

(87) PCT Pub. No.: WO2018/072283
PCT Pub. Date: Apr. 26, 2018

(65) Prior Publication Data
US 2018/0212191 A1    Jul. 26, 2018

(51) Int. Cl.
*H01L 51/52*   (2006.01)
*H01L 51/56*   (2006.01)
(Continued)

(52) U.S. Cl.
CPC ...... *H01L 51/5256* (2013.01); *H01L 25/0753* (2013.01); *H01L 27/1214* (2013.01);
(Continued)

(58) Field of Classification Search
None
See application file for complete search history.

(56) References Cited

U.S. PATENT DOCUMENTS 8,569,951 B2 * 10/2013 Ryu .................... H01L 51/5256
                                                               313/504
9,246,132 B2 *  1/2016 Kang .................. H01L 51/5259
(Continued)

*Primary Examiner* — Minh-Loan Tran
(74) *Attorney, Agent, or Firm* — Leong C. Lei

(57) ABSTRACT

The present invention provides an OLED display and a manufacturing method thereof. The OLED display of the present invention includes an OLED substrate and a thin film encapsulation layer disposed on the OLED substrate. The thin film encapsulation layer includes a patterned the high thermal conductivity layer and the high thermal conductivity layer is provided with a plurality of openings formed therein to correspond, in a one to one manner, to a plurality of sub-pixel areas of the OLED substrate so as to prevent the high thermal conductivity layer from absorbing light and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device.

13 Claims, 4 Drawing Sheets

(51) Int. Cl.
*H01L 27/32* (2006.01)
*H01L 27/12* (2006.01)
*H01L 25/075* (2006.01)

(52) U.S. Cl.
CPC ...... *H01L 27/1248* (2013.01); *H01L 27/1251* (2013.01); *H01L 27/1259* (2013.01); *H01L 27/3213* (2013.01); *H01L 51/5237* (2013.01); *H01L 51/5253* (2013.01); *H01L 51/5296* (2013.01); *H01L 51/56* (2013.01)

(56) References Cited

U.S. PATENT DOCUMENTS

2005/0127371 A1* 6/2005 Yamazaki ............ H01L 27/3244
 257/72
2009/0252975 A1* 10/2009 Lee ...................... C08G 77/045
 428/447

\* cited by examiner

OLED DISPLAY AND MANUFACTURING METHOD THEREOF

BACKGROUND OF THE INVENTION

1. Field of the Invention

The present invention relates to the field of flat panel display technology and more particular to an organic light-emitting diode (OLED) display and a manufacturing method thereof.

2. The Related Arts

OLED displays possess advantages, such as being self-luminous, high brightness, wide view angle, high contrast, being flexible, and low power consumption, and thus attract much attention as a new generation of displaying solution that gradually takes the place of traditional liquid crystal displays. It is now a symbol of being high tech by adopting an OLED display panel from small size ones used in mobile phone display screens to large size ones used in high definition flat panel televisions.

The OLED based display technology is different from the traditional liquid crystal display technology in that no backlighting is necessary and an extremely thin organic material coating layer and a glass substrate are involved so that when an electrical current is conducted therethrough, the organic material emits light. However, the organic material is susceptible to reaction with moisture and oxygen and thus, a display based that is based on the organic material is subject to extremely severe requirement for packaging of an OLED display panel. Consequently, packaging an OLED device to improve sealing of the interior of the device and to achieve isolation from the external environment to the greatest extent would be indispensable to stable emission of light of the OLED device.

The most commonly adopted processes of packaging existing OLED device involve ultraviolet curable resin in combination with a rigid package plate (such as glass or metal) to cover the packaging. Such processes are not fit for flexible devices. Thus, technical solutions that are based on thin film encapsulation (TFE) that uses stacked films to package an OLED device have also been proposed and the related thin film encapsulation art is considered vital for flexible displaying is regarded as a mainstream technique in the future. On the other hand, massive results of study and research reveal deterioration of the performance of an OLED device is closely related to material degradation resulting from heat generated by the device itself. Thus, to effectively isolate external moisture and oxygen and to reduce heat-induced decomposition caused by the heat generated by a device are imperative factors for extension of the service life of the device.

Currently, the most widely used TFE techniques generally adopt an inorganic/organic/inorganic alternate structure, such as a thin film encapsulation structure disclosed in U.S. Pat. No. 8,569,951, this thin film encapsulation structure adopting a cyclically alternating arrangement of organics and inorganics, in which the inorganic layers function to block external moisture and oxygen, while the organic layers function for relief of stress and planarization covering of particulate substances. Soon afterwards, Samsung massively reported a series of secondary type TFE techniques, such as US2009/0252975, US2015/0188084, US2015/0153779, and US 2015/0079707. However, it is known that such packaging techniques involve inorganic metal oxides and organic materials, of which thermal conductivity is generally poor, making it hard to conduct away heat generated by a device.

Korean institute of industrial research discloses in Organic Electrics an OLED device structure, in which a TFE structure comprises a multiple-layer structure including alternate polymer layers and aluminum oxide ($Al_2O_3$) layers and the TFE structure is finally provided, on a topmost layer, with a copper (Cu) heat dissipation plate. The OLED device that comprises the copper heat dissipation plate exhibits an operation temperature that is lower than that of a device having no such a copper heat dissipation plate. In addition, with the advance of operation time, the device with the copper heat dissipation plate shows a temperature increase trend that is significantly suppressed. Such a technique provides a better guidance solution for heat transfer of an OLED device. However, the transmission rate of Cu is not high enough, and, particularly for application in a top emission device in the display field, such a technique is subjected great limitation.

Korea Institute of Science and Technology reported in Journal of Information Display a thin film encapsulation technique involving a silver inlay layer. This thin film encapsulation technique uses a polymer that contains nanometer particulates of silicon as organic layers and aluminum oxide ($Al_2O_3$) as inorganic layers, with an extremely thin layer of silver (Ag) interposed between two $Al_2O_3$ inorganic layers and an additional layer of Ag placed on the topmost layer. A thin film encapsulation structure adopting such a technique would reduce water vapor transmission rate (WVPR) of the thin film to $10^{-5}$ $g/m^2/d$. Also, the addition of Ag helps effectively transfer heat generated in the interior of the device so as to improve the stability of the device. However, covering Ag on an entire surface of the thin film in a top emission device would reduce outward emission of light so that such a heat conducting material suffers certain limitations.

SUMMARY OF THE INVENTION

An objective of the present invention is to provide an organic light-emitting diode (OLED) display, which allows for effective transfer of heat generated during an operation of an OLED device, reduces thermal decomposition of a material of the OLED device, and extends the service life of the device while ensuring sufficient capability of the device in blocking external moisture and oxygen.

Another objective of the present invention is to provide a manufacturing method of an OLED display, which includes a patterned layer of high thermal conductivity in a thin film encapsulation structure to provide effective transfer of heat generated during an operation of an OLED device, reduce thermal decomposition of a material of the OLED device, and extend the service life of the device while ensuring sufficient capability of the device in blocking external moisture and oxygen.

To achieve the above objectives, the present invention provides an OLED display, which comprises an OLED substrate and a thin film encapsulation layer disposed on the OLED substrate;

the thin film encapsulation layer comprising a first inorganic passivation layer disposed on the OLED substrate, a high thermal conductivity layer disposed on the first inorganic passivation layer, a first organic buffer layer disposed on the first inorganic passivation layer and the high thermal conductivity layer, and a second inorganic passivation layer disposed on the first organic buffer layer;

the OLED substrate comprising a plurality of pixel units arranged in an array, each of the pixel units comprising a plurality of sub-pixel areas arranged in an array;

the high thermal conductivity layer comprising a plurality of openings formed therein to correspond, in a one to one manner, to the plurality the sub-pixel areas of the plurality of pixel units, the first organic buffer layer completely filling up the plurality of openings formed in the high thermal conductivity layer.

The high thermal conductivity layer comprises a material that comprises diamond-like carbon, silver, aluminum, aluminum nitride, graphene, or copper, the high thermal conductivity layer having a thickness of 1-1000 nm.

The thin film encapsulation layer further comprises a second organic buffer layer disposed on the second inorganic passivation layer and a third inorganic passivation layer disposed on the second organic buffer layer.

The first, second, and third inorganic passivation layers each comprise a material that comprises $Al_2O_3$, $TiO_2$, SiNx, SiCNx, or SiOx, the first, second, and third inorganic passivation layers each having a thickness of 0.5-1 µm;

the first and second organic buffer layers each comprising a material that comprises hexamethyldisiloxane, polyacrylate polymers, polycarbonate polymers, or polystyrene, the first and second organic buffer layers each having a thickness of 4-8 µm.

Each of the pixel units comprises four sub-pixel areas arranged in a 2×2 array, the four sub-pixel areas being respectively white, red, blue, and green sub-pixel areas.

The present invention also provides a manufacturing method of an OLED display, which comprises the following steps:

Step 1: providing an OLED substrate, wherein the OLED substrate comprises a plurality of pixel units arranged in an array and each of the pixel units comprises a plurality of sub-pixel areas arranged in an array; and Step 2: forming a thin film encapsulation layer on the OLED substrate to provide an OLED display;

wherein the thin film encapsulation layer is formed with a process that comprises the following steps:

Step 21: depositing and forming a first inorganic passivation layer on the OLED substrate;

Step 22: forming a high thermal conductivity layer on the first inorganic passivation layer, the high thermal conductivity layer comprising a plurality of openings that correspond, in a one to one manner, the plurality of sub-pixel areas of the plurality of pixel units;

Step 23: form a first organic buffer layer on the first inorganic passivation layer and the high thermal conductivity layer such that the first organic buffer layer completely fills up the plurality of openings formed in the high thermal conductivity layer; and Step 24: depositing and forming a second inorganic passivation layer on the first organic buffer layer.

Step 22 comprises applying vacuum deposition with a mask plate to direct form the high thermal conductivity layer that comprises the plurality of openings; or alternatively, applying plasma enhanced chemical vapor deposition (PECVD), atomic layer deposition (ALD), pulsed laser deposition (PLD), or sputtering to first deposit a thermally conductive layer and then, subjecting the thermally conductive film to treatment through photoengraving so as to form the plurality of openings in the thermally conductive film to thus provide the high thermal conductivity layer;

wherein the high thermal conductivity layer comprises a material that comprises diamond-like carbon, silver, aluminum, aluminum nitride, graphene, or copper, and the high thermal conductivity layer has a thickness of 1-1000 nm.

The process with which the thin film encapsulation layer is formed further comprises:

Step 25: forming a second organic buffer layer on the second inorganic passivation layer; and Step 26: depositing and forming a third inorganic passivation layer on the second organic buffer layer.

The first, second, and third inorganic passivation layers are each formed with PECVD, ALD, PLD, or sputtering; the first, second, and third inorganic passivation layers each comprise a material that comprises $Al_2O_3$, $TiO_2$, SiNx, SiCNx, or SiOx; and the first, second, and third inorganic passivation layers each have a thickness of 0.5-1 µm;

wherein the first and second organic buffer layers are each formed with ink jet printing (IJP), PECVD, screen printing, or slot coating; the first and second organic buffer layers each comprise a material that comprises hexamethyldisiloxane, polyacrylate polymers, polycarbonate polymers, or polystyrene; and the first and second organic buffer layers each have a thickness of 4-8 µm.

In the OLED substrate provided in Step 1, each of the pixel units comprises four sub-pixel areas arranged in a 2×2 array and the four sub-pixel areas are respectively white, red, blue, and green sub-pixel areas.

The present invention further provides an OLED display, which comprises an OLED substrate and a thin film encapsulation layer disposed on the OLED substrate;

the thin film encapsulation layer comprising a first inorganic passivation layer disposed on the OLED substrate, a high thermal conductivity layer disposed on the first inorganic passivation layer, a first organic buffer layer disposed on the first inorganic passivation layer and the high thermal conductivity layer, and a second inorganic passivation layer disposed on the first organic buffer layer;

the OLED substrate comprising a plurality of pixel units arranged in an array, each of the pixel units comprising a plurality of sub-pixel areas arranged in an array;

the high thermal conductivity layer comprising a plurality of openings formed therein to correspond, in a one to one manner, to the plurality the sub-pixel areas of the plurality of pixel units, the first organic buffer layer completely filling up the plurality of openings formed in the high thermal conductivity layer;

wherein the high thermal conductivity layer comprises a material that comprises diamond-like carbon, silver, aluminum, aluminum nitride, graphene, or copper, the high thermal conductivity layer having a thickness of 1-1000 nm; and wherein each of the pixel units comprises four sub-pixel areas arranged in a 2×2 array, the four sub-pixel areas being respectively white, red, blue, and green sub-pixel areas.

The efficacy of the present invention is that the present invention provides an OLED display, which comprises an OLED substrate and a thin film encapsulation layer disposed on the OLED substrate, wherein the thin film encapsulation layer comprises a patterned the high thermal conductivity layer and the high thermal conductivity layer is provided with a plurality of openings formed therein to correspond, in a one to one manner, to a plurality of sub-pixel areas of the OLED substrate so as to prevent the high thermal conductivity layer from absorbing light and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device; and the present invention provides a manufacturing method of an OLED display, which adopts thin film encapsulation to package an OLED device and adds a patterned high thermal conductivity layer in the thin film encapsulation structure, wherein the high thermal conductivity layer is provided with a plurality of openings formed therein to correspond, in a one to one manner, to a plurality of sub-pixel areas of the OLED substrate so as to prevent the high thermal conductivity layer from absorbing light and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
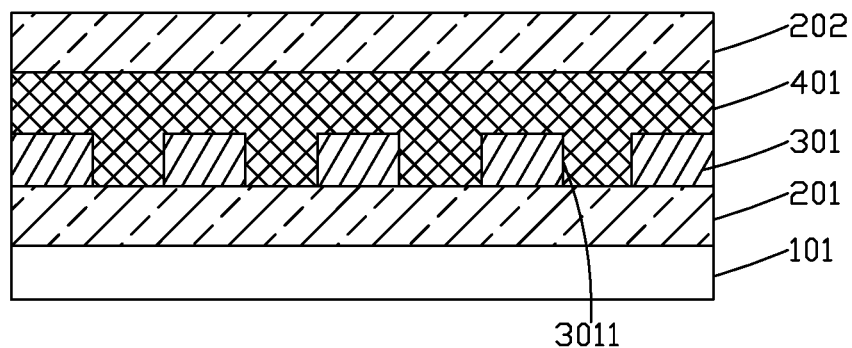
FIG. 1 is a schematic view showing the structure of a first embodiment of an organic light-emitting diode (OLED) display according to the present invention.

Referring to FIG. 1, which is a schematic view showing the structure of a first embodiment of an organic light-emitting diode (OLED) display according to the present invention, in the instant embodiment, the OLED display comprises an OLED substrate 101 and a thin film encapsulation layer disposed on the OLED substrate 101.

The thin film encapsulation layer comprises a first inorganic passivation layer 201 disposed on the OLED substrate 101, a high thermal conductivity layer 301 disposed on the first inorganic passivation layer 201, a first organic buffer layer 401 disposed on the first inorganic passivation layer 201 and the high thermal conductivity layer 301, and a second inorganic passivation layer 202 disposed on the first organic buffer layer 401.

The OLED substrate 101 comprises a plurality of pixel units arranged in an array. Each of the pixel units comprises a plurality of sub-pixel areas arranged in an array.

The high thermal conductivity layer 301 is provided with a plurality of openings 3011 formed therein to correspond, in a one to one manner, to the plurality the sub-pixel areas of the plurality of pixel units. The first organic buffer layer 401 completely filling up the plurality of openings 3011 formed in the high thermal conductivity layer 301.

Specifically, in the present invention, the plurality of openings 3011 of the high thermal conductivity layer 301 are arranged in a manner identical to the arrangement of the plurality of sub-pixel areas of the plurality of pixel units and each of the openings 3011 has a size consistent with a size of the corresponding one of the sub-pixel areas so as to prevent the high thermal conductivity layer 301 from absorbing light emitting from the sub-pixel areas and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device.

Specifically, in the instant embodiment, each of the pixel units comprises four sub-pixel areas arranged in a 2×2 array. The four sub-pixel areas are respectively white, red, blue, and green sub-pixel areas. Each of the openings 3011 that corresponds to the white sub-pixel area has a size consistent with a size of the white sub-pixel area; and similarly, the openings 3011 that correspond to the red, blue, and green sub-pixel areas have sizes respectively consistent with sizes of the red, blue, and green sub-pixel areas.

Specifically, the high thermal conductivity layer 301 comprises a material that is a metallic or non-metal high thermal conductivity material, such as diamond-like carbon (DLC), silver, aluminum (Al), aluminum nitride (AlN), graphene, and copper.

Specifically, the high thermal conductivity layer 301 has a thickness of 1-1000 nm.

Specifically, the first and second inorganic passivation layers 201, 202 comprise a material that is a material for blocking external moisture and oxygen, such as $Al_2O_3$, titanium oxide ($TiO_2$), silicon nitride (SiNx), silicon carbon nitride (SiCNx), and silicon oxide (SiOx).

Specifically, the first and second inorganic passivation layers 201, 202 each have a thickness of 0.5-1 μm.

Specifically, the first organic buffer layer 401 comprises a material that is a material for stress relief and covering particulates, such as hexamethyldisiloxane (HMDSO), polyacrylate polymers (such as acrylic), polycarbonate polymers, and polystyrene.

Specifically, the first organic buffer layer 401 has a thickness of 4-8 μm.

Figure 2:
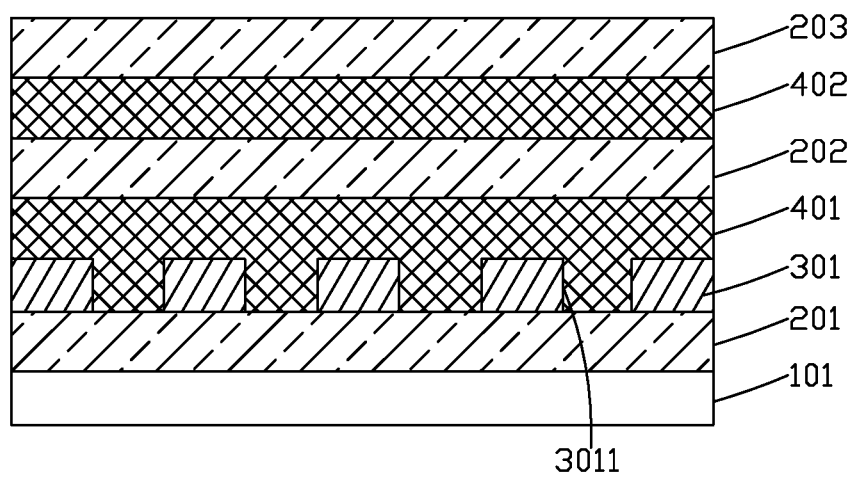
FIG. 2 is a schematic view showing the structure of a second embodiment of the OLED display according to the present invention.

Referring to FIG. 2, which is a schematic view showing a structure of a second embodiment of an OLED display according to the present invention, compared to the first embodiment described above, the thin film encapsulation layer further comprises a second organic buffer layer 402 disposed on the second inorganic passivation layer 202 and a third inorganic passivation layer 203 disposed on the second organic buffer layer 402. In this embodiment, the second organic buffer layer 402 and the first organic buffer layer 401 comprise a material comprising hexamethyldisiloxane, polyacrylate polymers, polycarbonate polymers, or polystyrene; and the second organic buffer layer 402 and the first organic buffer layer 401 each have a thickness of 4-8 μm. The third inorganic passivation layer 203 and the first and second inorganic passivation layers 201, 202 comprise a material comprising $Al_2O_3$, $TiO_2$, SiNx, SiCNx, or SiOx; and the third inorganic passivation layer 203 and the first and second inorganic passivation layers 201, 202 each have a thickness of 0.5-1 μm. The remaining is the same as those of the first embodiment described above and thus, repeated description is omitted herein.

Figure 3:
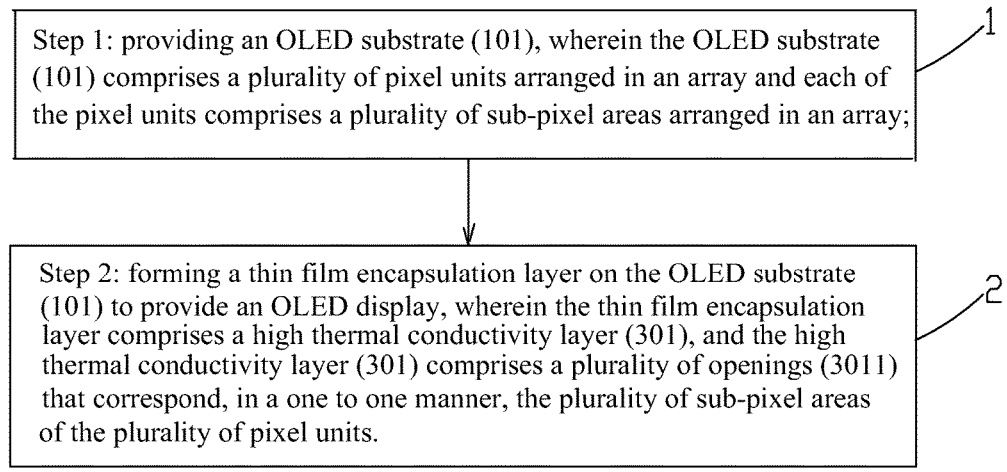
FIG. 3 is a flow chart illustrating a manufacturing method of an OLED display according to the present invention.

Based on the OLED display described above, reference being had to FIG. 3, the present invention further provides a manufacturing method of an OLED display, of which a first example specifically comprises the following steps:

Step 1: providing an OLED substrate 101, wherein the OLED substrate 101 comprises a plurality of pixel units arranged in an array and each of the pixel units comprises a plurality of sub-pixel areas arranged in an array.

Figure 4:
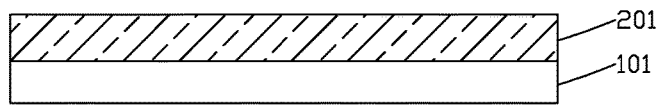
FIG. 4 is a schematic view illustrating Step 21 of the manufacturing method of the OLED display according to the present invention.

Step 2: forming a thin film encapsulation layer on the OLED substrate 101 to provide an OLED display;

wherein the thin film encapsulation layer is formed through a process that comprises the following steps:

Step 21: as shown in FIG. 4, applying plasma enhanced chemical vapor deposition (PECVD), atomic layer deposition (ALD), pulsed laser deposition (PLD), or sputtering to deposit and form a first inorganic passivation layer 201 on the OLED substrate 101.

Specifically, the first inorganic passivation layer 201 comprises a material that is a material for blocking external moisture and oxygen, such as $Al_2O_3$, $TiO_2$, SiNx, SiCNx, and SiOx.

Specifically, the first inorganic passivation layer 201 has a thickness of 0.5-1 μm.

Figure 5:
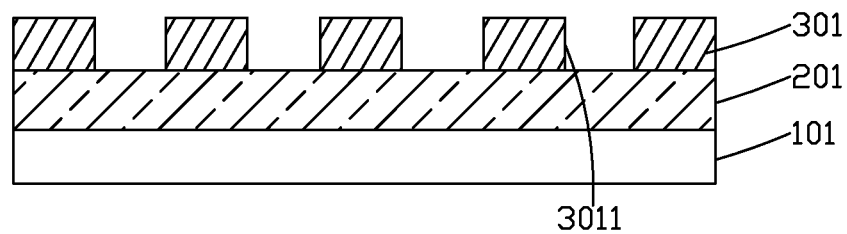
FIG. 5 is a schematic view illustrating Step 22 of the manufacturing method of the OLED display according to the present invention.

Step 22: as shown in FIG. 5, forming a high thermal conductivity layer 301 on the first inorganic passivation layer 201, the high thermal conductivity layer 301 comprising a plurality of openings 3011 that correspond, in a one to one manner, the plurality of sub-pixel areas of the plurality of pixel units.

Specifically, Step 22 comprises applying vacuum deposition with a mask plate to direct form the high thermal conductivity layer 301 that comprises the plurality of openings 3011; or alternatively, applying various metal or non-metal deposition processes, such as PECVD, ALD, PLD, and sputtering, to first deposit a thermally conductive layer and then, subjecting the thermally conductive film to treatment through photoengraving so as to form the plurality of openings 3011 in the thermally conductive film to thus provide the high thermal conductivity layer 301.

Specifically, in the present invention, the plurality of openings 3011 of the high thermal conductivity layer 301 are arranged in a manner identical to the arrangement of the plurality of sub-pixel areas of the plurality of pixel units and each of the openings 3011 has a size consistent with a size of the corresponding one of the sub-pixel areas so as to prevent the high thermal conductivity layer 301 from absorbing light emitting from the sub-pixel areas and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device.

Specifically, in the instant embodiment, each of the pixel units comprises four sub-pixel areas arranged in a 2×2 array. The four sub-pixel areas are respectively white, red, blue, and green sub-pixel areas. Each of the openings 3011 that corresponds to the white sub-pixel area has a size consistent with a size of the white sub-pixel area; and similarly, the openings 3011 that correspond to the red, blue, and green sub-pixel areas have sizes respectively consistent with sizes of the red, blue, and green sub-pixel areas.

Specifically, the high thermal conductivity layer 301 comprises a material that is a metallic or non-metal high thermal conductivity material, such as diamond-like carbon, silver, aluminum, aluminum nitride, graphene, and copper.

Specifically, the high thermal conductivity layer 301 has a thickness of 1-1000 nm.

Figure 6:
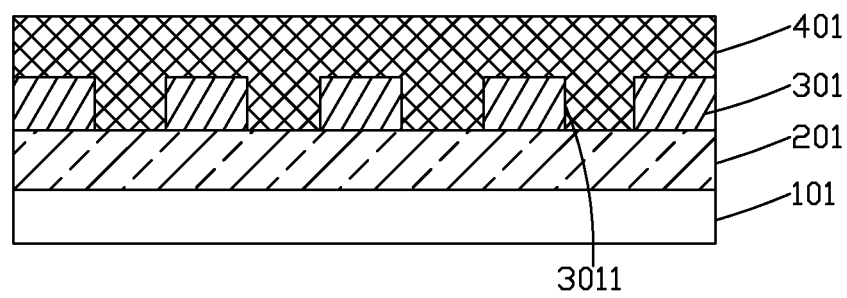
FIG. 6 is a schematic view illustrating Step 23 of the manufacturing method of the OLED display according to the present invention.

Step 23, as shown in FIG. 6, applying ink jet printing (IJP), PECVD, screen printing, or slot coating to form a first organic buffer layer 401 on the first inorganic passivation layer 201 and the high thermal conductivity layer 301 such that the first organic buffer layer 401 completely fills up the plurality of openings 3011 formed in the high thermal conductivity layer 301.

Specifically, the first organic buffer layer 401 comprises a material that is a material for stress relief and covering particulates, such as hexamethyldisiloxane, polyacrylate polymers (such as acrylic), polycarbonate polymers, and polystyrene.

Specifically, the first organic buffer layer 401 has a thickness of 4-8 μm.

Step 24: applying PECVD, ALD, PLD, or sputtering to deposit and form a second inorganic passivation layer 202 on the first organic buffer layer 401 so as to provide an OLED display shown in FIG. 1.

Specifically, the second inorganic passivation layer 202 comprises a material that is a material for blocking external moisture and oxygen, such as $Al_2O_3$, $TiO_2$, SiNx, SiCNx, and SiOx; and the second inorganic passivation layer 202 has a thickness of 0.5-1 μm.

Figure 7:
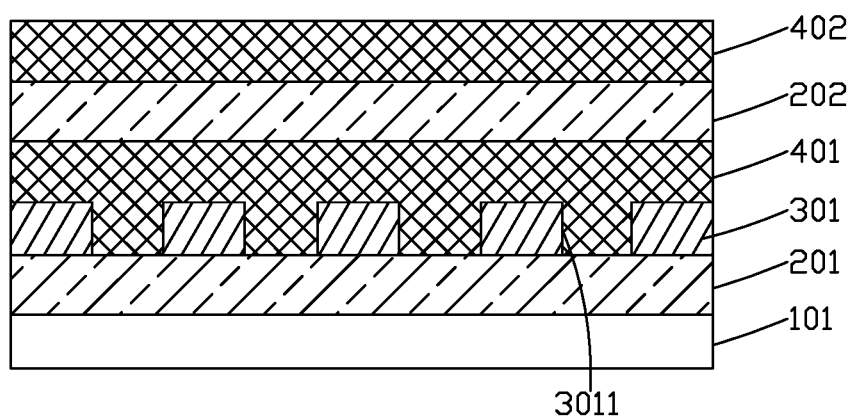
FIG. 7 is a schematic view illustrating Step 25 of a second embodiment of the manufacturing method of the OLED display according to the present invention.

A second example of the manufacturing method of an OLED display according to the present invention, when compared to the first example described above, involves a process of forming the thin film encapsulation layer that further comprises:

Step 25: as shown in FIG. 7, coating and forming a second organic buffer layer 402 on the second inorganic passivation layer 202.

Specifically, the second organic buffer layer 402 and the first organic buffer layer 401 are each formed with IJP, PECVD, screen printing, or slot coating; the second organic buffer layer 402 and the first organic buffer layer 401 comprises a material comprising hexamethyldisiloxane, polyacrylate polymers, polycarbonate polymers, or polystyrene; and the second organic buffer layer 402 and the first organic buffer layer 401 each have a thickness of 4-8 μm.

Step 26: coating and forming a third inorganic passivation layer 203 on the second organic buffer layer 402 so as to provide an OLED display as shown in FIG. 2.

Specifically, the third inorganic passivation layer 203 and the first and second inorganic passivation layers 201, 202 are each formed with PECVD, ALD, PLD, or sputtering; the third inorganic passivation layer 203 and the first and second inorganic passivation layers 201, 202 each comprise a material that comprising $Al_2O_3$, $TiO_2$, SiNx, SiCNx, or SiOx; and the third inorganic passivation layer 203 and the first and second inorganic passivation layers 201, 202 each have a thickness of 0.5-1 μm.

In summary, the present invention provides an OLED display, which comprises an OLED substrate and a thin film encapsulation layer disposed on the OLED substrate, wherein the thin film encapsulation layer comprises a patterned the high thermal conductivity layer and the high thermal conductivity layer is provided with a plurality of openings formed therein to correspond, in a one to one manner, to a plurality of sub-pixel areas of the OLED substrate so as to prevent the high thermal conductivity layer from absorbing light and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device; and the present invention provides a manufacturing method of an OLED display, which adopts thin film encapsulation to package an OLED device and adds a patterned high thermal conductivity layer in the thin film encapsulation structure, wherein the high thermal conductivity layer is provided with a plurality of openings formed therein to correspond, in a one to one manner, to a plurality of sub-pixel areas of the OLED substrate so as to prevent the high thermal conductivity layer from absorbing light and also help eliminate the constraint that a top emission device is only allowed to use a material having a high transmission rate, thereby allowing for effective transfer of heat generated during an operation of an OLED device without deteriorating light emission efficiency of the device, reducing thermal decomposition of a material of the OLED device, and ensuring the device possesses sufficiency capability of blocking external moisture and oxygen to thus extend the service life of the device.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An organic light-emitting diode (OLED) display, comprising an OLED substrate and a thin film encapsulation layer disposed on the OLED substrate;

the thin film encapsulation layer comprising a first inorganic passivation layer disposed on the OLED substrate, a high thermal conductivity layer disposed on the first inorganic passivation layer, a first organic buffer layer disposed on the first inorganic passivation layer and the high thermal conductivity layer, and a second inorganic passivation layer disposed on the first organic buffer layer;

the OLED substrate comprising a plurality of pixel units arranged in an array, each of the pixel units comprising a plurality of sub-pixel areas arranged in an array;

the high thermal conductivity layer comprising a plurality of openings formed therein to correspond, in a one to one manner, to the plurality the sub-pixel areas of the plurality of pixel units, the first organic buffer layer completely filling up the plurality of openings formed in the high thermal conductivity layer.

2. The OLED display as claimed in claim 1, wherein the high thermal conductivity layer comprises a material that comprises diamond-like carbon, silver, aluminum, aluminum nitride, graphene, or copper, the high thermal conductivity layer having a thickness of 1-1000 nm.

3. The OLED display as claimed in claim 1, wherein the thin film encapsulation layer further comprises a second organic buffer layer disposed on the second inorganic passivation layer and a third inorganic passivation layer disposed on the second organic buffer layer.

4. The OLED display as claimed in claim 3, wherein the first, second, and third inorganic passivation layers each comprise a material that comprises $Al_2O_3$, $TiO_2$, SiNx, SiCNx, or SiOx, the first, second, and third inorganic passivation layers each having a thickness of 0.5-1 μm;

the first and second organic buffer layers each comprising a material that comprises hexamethyldisiloxane, polyacrylate polymers, polycarbonate polymers, or polystyrene, the first and second organic buffer layers each having a thickness of 4-8 μm.

5. The OLED display as claimed in claim 1, wherein each of the pixel units comprises four sub-pixel areas arranged in a 2×2 array, the four sub-pixel areas being respectively white, red, blue, and green sub-pixel areas.

6. A manufacturing method of an organic light-emitting diode (OLED) display, comprising the following steps:

Step 1: providing an OLED substrate, wherein the OLED substrate comprises a plurality of pixel units arranged in an array and each of the pixel units comprises a plurality of sub-pixel areas arranged in an array; and Step 2: forming a thin film encapsulation layer on the OLED substrate to provide an OLED display;

wherein the thin film encapsulation layer is formed with a process that comprises the following steps:

Step 21: depositing and forming a first inorganic passivation layer on the OLED substrate;

Step 22: forming a high thermal conductivity layer on the first inorganic passivation layer, the high thermal conductivity layer comprising a plurality of openings that correspond, in a one to one manner, the plurality of sub-pixel areas of the plurality of pixel units;

Step 23: form a first organic buffer layer on the first inorganic passivation layer and the high thermal conductivity layer such that the first organic buffer layer completely fills up the plurality of openings formed in the high thermal conductivity layer; and Step 24: depositing and forming a second inorganic passivation layer on the first organic buffer layer.

7. The manufacturing method of the OLED display as claimed in claim 6, wherein Step 22 comprises applying vacuum deposition with a mask plate to direct form the high thermal conductivity layer that comprises the plurality of openings; or alternatively, applying plasma enhanced chemical vapor deposition (PECVD), atomic layer deposition (ALD), pulsed laser deposition (PLD), or sputtering to first deposit a thermally conductive layer and then, subjecting the thermally conductive film to treatment through photoengraving so as to form the plurality of openings in the thermally conductive film to thus provide the high thermal conductivity layer;

wherein the high thermal conductivity layer comprises a material that comprises diamond-like carbon, silver, aluminum, aluminum nitride, graphene, or copper, and the high thermal conductivity layer has a thickness of 1-1000 nm.

8. The manufacturing method of the OLED display as claimed in claim 6, wherein the process with which the thin film encapsulation layer is formed further comprises:

Step 25: forming a second organic buffer layer on the second inorganic passivation layer; and Step 26: depositing and forming a third inorganic passivation layer on the second organic buffer layer.

9. The manufacturing method of the OLED display as claimed in claim 8, wherein the first, second, and third inorganic passivation layers are each formed with PECVD, ALD, PLD, or sputtering; the first, second, and third inorganic passivation layers each comprise a material that comprises $Al_2O_3$, $TiO_2$, SiNx, SiCNx, or SiOx; and the first, second, and third inorganic passivation layers each have a thickness of 0.5-1 μm;

wherein the first and second organic buffer layers are each formed with ink jet printing (UP), PECVD, screen printing, or slot coating; the first and second organic buffer layers each comprise a material that comprises hexamethyldisiloxane, polyacrylate polymers, polycarbonate polymers, or polystyrene; and the first and second organic buffer layers each have a thickness of 4-8 μm.

10. The manufacturing method of the OLED display as claimed in claim 6, wherein in the OLED substrate provided in Step 1, each of the pixel units comprises four sub-pixel areas arranged in a 2×2 array and the four sub-pixel areas are respectively white, red, blue, and green sub-pixel areas.

11. An organic light-emitting diode (OLED) display, comprising an OLED substrate and a thin film encapsulation layer disposed on the OLED substrate;

the thin film encapsulation layer comprising a first inorganic passivation layer disposed on the OLED substrate, a high thermal conductivity layer disposed on the first inorganic passivation layer, a first organic buffer layer disposed on the first inorganic passivation layer and the high thermal conductivity layer, and a second inorganic passivation layer disposed on the first organic buffer layer;

the OLED substrate comprising a plurality of pixel units arranged in an array, each of the pixel units comprising a plurality of sub-pixel areas arranged in an array;

the high thermal conductivity layer comprising a plurality of openings formed therein to correspond, in a one to one manner, to the plurality the sub-pixel areas of the plurality of pixel units, the first organic buffer layer completely filling up the plurality of openings formed in the high thermal conductivity layer;

wherein the high thermal conductivity layer comprises a material that comprises diamond-like carbon, silver, aluminum, aluminum nitride, graphene, or copper, the high thermal conductivity layer having a thickness of 1-1000 nm; and wherein each of the pixel units comprises four sub-pixel areas arranged in a 2×2 array, the four sub-pixel areas being respectively white, red, blue, and green sub-pixel areas.

12. The OLED display as claimed in claim 11, wherein the thin film encapsulation layer further comprises a second organic buffer layer disposed on the second inorganic passivation layer and a third inorganic passivation layer disposed on the second organic buffer layer.

13. The OLED display as claimed in claim 12, wherein the first, second, and third inorganic passivation layers each comprise a material that comprises $Al_2O_3$, $TiO_2$, SiNx, SiCNx, or SiOx, the first, second, and third inorganic passivation layers each having a thickness of 0.5-1 μm;

the first and second organic buffer layers each comprising a material that comprises hexamethyldisiloxane, polyacrylate polymers, polycarbonate polymers, or polystyrene, the first and second organic buffer layers each having a thickness of 4-8 μm.

\* \* \* \* \*